United States Patent
Bernick et al.

(10) Patent No.: US 8,951,394 B2
(45) Date of Patent: Feb. 10, 2015

(54) CYLINDRICAL MAGNETRON HAVING A SHUNT

(75) Inventors: Mark A. Bernick, White Oak, PA (US); Richard Newcomb, McKeesport, PA (US)

(73) Assignee: Angstrom Sciences, Inc., Duquesne, PA (US)

( * ) Notice: Subject to any disclaimer, the term of this patent is extended or adjusted under 35 U.S.C. 154(b) by 228 days.

(21) Appl. No.: 12/887,065

(22) Filed: Sep. 21, 2010

(65) Prior Publication Data
US 2011/0186427 A1 Aug. 4, 2011

Related U.S. Application Data

(60) Provisional application No. 61/299,669, filed on Jan. 29, 2010.

(51) Int. Cl.
*C23C 14/00* (2006.01)
*C25B 11/00* (2006.01)
*C25B 13/00* (2006.01)
*C23C 14/35* (2006.01)
*C23C 14/54* (2006.01)

(52) U.S. Cl.
CPC .................. *C23C 14/35* (2013.01); *C23C 14/54* (2013.01)
USPC ............. 204/298.16; 204/298.21; 204/298.22

(58) Field of Classification Search
CPC ...................................................... H01J 37/3461
USPC ........................... 204/298.16, 298.21, 298.22
See application file for complete search history.

(56) References Cited

U.S. PATENT DOCUMENTS

| 4,448,653 | A | | 5/1984 | Wegmann |
| 5,328,585 | A | | 7/1994 | Stevenson et al. |
| 5,364,518 | A | * | 11/1994 | Hartig et al. ............. 204/298.22 |
| 5,571,393 | A | | 11/1996 | Taylor et al. |
| 5,736,019 | A | | 4/1998 | Bernick |
| 5,814,195 | A | | 9/1998 | Lehan et al. |
| 5,865,970 | A | | 2/1999 | Stelter |
| 6,171,461 | B1 | | 1/2001 | Bernick |
| 6,299,740 | B1 | * | 10/2001 | Hieronymi et al. ...... 204/298.03 |
| 6,365,010 | B1 | | 4/2002 | Hollars |
| 6,375,814 | B1 | | 4/2002 | De Bosscher et al. |
| 6,409,897 | B1 | | 6/2002 | Wingo |
| 6,787,011 | B2 | | 9/2004 | Ueda et al. |

(Continued)

FOREIGN PATENT DOCUMENTS

| JP | 57-145983 A | 9/1982 |
| JP | 10-330935 A | 12/1998 |
| KR | 10-2005-0087104 B1 | 8/2005 |
| WO | 2006042808 A1 | 4/2006 |

*Primary Examiner* — Keith Hendricks
*Assistant Examiner* — Ibrahime A Abraham
(74) *Attorney, Agent, or Firm* — The Webb Law Firm

(57) ABSTRACT

A magnetron sputtering electrode for use in a rotatable cylindrical magnetron sputtering device, the electrode including a cathode body defining a magnet receiving chamber and a cylindrical target surrounding the cathode body. The target is rotatable about the cathode body A magnet arrangement is received within the magnet receiving chamber, the magnet arrangement including a plurality of magnets. A shunt is secured to the cathode body and proximate to a side of the magnet arrangement, the shunt extending in a plane substantially parallel to the side of the magnet arrangement. A method of fine-tuning a magnetron sputtering electrode in a rotatable cylindrical magnetron sputtering device is also disclosed.

16 Claims, 15 Drawing Sheets

(56) References Cited

U.S. PATENT DOCUMENTS

| | | |
|---|---|---|
| 7,223,322 B2 | 5/2007 | Bernick |
| 2003/0173217 A1 | 9/2003 | Crowley |
| 2004/0178056 A1* | 9/2004 | De Bosscher et al. ... 204/192.12 |
| 2006/0049043 A1 | 3/2006 | Matuska et al. |
| 2006/0065524 A1 | 3/2006 | Newcomb et al. |
| 2006/0278519 A1 | 12/2006 | Malaszewski et al. |
| 2008/0012460 A1 | 1/2008 | Bernick et al. |
| 2008/0047831 A1* | 2/2008 | Richert et al. ........... 204/298.12 |

* cited by examiner

CYLINDRICAL MAGNETRON HAVING A SHUNT

CROSS-REFERENCE TO RELATED APPLICATIONS

This application claims the benefit of U.S. Provisional Application No. 61/299,669, filed Jan. 29, 2010.

BACKGROUND OF THE INVENTION

1. Field of the Invention

The present invention relates to a rotatable cylindrical magnetron sputtering apparatus having a shunt for fine-tuning the magnetic field.

2. Description of Related Art

A typical magnetron sputtering device includes a vacuum chamber having an electrode contained therein, wherein the electrode includes a cathode portion, an anode portion and a target. The term electrode is oftentimes referred to in the industry as a cathode. In operation, a vacuum is drawn in the vacuum chamber followed by the introduction of a process gas into the chamber. Electrical power supplied to the electrode produces an electronic discharge which ionizes the process gas and produces charged gaseous ions from the atoms of the process gas. The ions are accelerated and retained within a magnetic field formed over the target, and are propelled toward the surface of the target which is composed of the material sought to be deposited on a substrate. Upon striking the target, the ions dislodge target atoms from the target which are then deposited upon the substrate. By varying the composition of the target and/or the process gas, a wide variety of substances can be deposited on various substrates. The result is the formation of an ultra-pure thin film deposition of target material on the substrate.

Over the last decade, the cylindrical magnetron has emerged as the leading technology for sputtering coating on glass substrates. The rotating cylindrical target surface provides for a constant sputtering surface, thus eliminating the traditional erosion groove and large non-sputtered areas associated with planar targets. Further, the cylindrical target eliminates large areas of dielectric buildup that can lead to arcing, material flaking, debris, and other process instabilities. Although the rotatable cylindrical magnetron has its advantages over planar magnetrons, the shape of the magnetic field which determines everything from field uniformity and deposition rate to target utilization may still be optimized further to improve the performance of the sputtering application. The use of stationary profiled magnets can be used to control the shape of the magnetic field which optimizes the performance of the sputtering application. U.S. Pat. Nos. 5,736,019 and 6,171,461, which are incorporated herein by reference, disclose and attempt to overcome under utilization of target material via the use of stationary profile magnets. The above-identified patents are directed to magnetron sputtering electrodes that include a plurality of profile magnets, each magnet including a top portion with an apex, wherein each apex is positioned adjacent a target supporting surface in the cathode body. The magnet cooperates to generate magnetic flux lines which form enclosed-looped magnetic tunnels adjacent to the front sputtering surfaces of the target. As described in the above-identified patents, these profile magnets result in optimum utilization of target materials at a reasonable rate of utilization. A problem with the conventional planar magnet arrangement is that the magnets have flat upper surfaces and, therefore, the target which the material is to be sputtered from is not completely utilized.

The development of mid-frequency AC power supplies has enabled continuous long-term sputtering of targets which are utilized in a reactive gas to form dielectric or poorly conductive thin films. Albeit a dramatic improvement above planar targets used in planar cathodes, rotatable cylindrical targets still have a region just beyond the magnetron ends (i.e., turnarounds) which are not sputtered, but rather collect a portion of the sputtered thin film. When the sputtered material builds up in these turnarounds or unetched regions to a substantial thickness thus forming an insulating layer, this layer can become a source of arcing. Although enabling power supply technology has increased process stability of the deposition process, it has simultaneously introduced increased complexity and cost into the design and arrangement of the hardware associated with the cathode drive assembly which delivers this power to the target surface. The two most common problems associated with the delivery of high power, mid-frequency (20 kHz-120 kHz) current to the cathode are (1) the ability of the brush assemblies to carry sufficient current without overheating and eroding due to the "skin-effect" of these frequencies and (2) the inherent eddy current effects induced by these frequencies which can cause extreme localized heating of various components, particularly the support bearing. To circumvent the high current requirements, many manufacturers are using custom brush assemblies with high silver content in order to overcome the above-mentioned problems. The design and manufacture of custom brushes used in these assemblies are not only costly, but the material is very brittle which can lead to a short operating life. For example, one such solution for addressing the eddy current problem is to use a custom designed ceramic bearing, which is costly and difficult to replace quickly.

Therefore, it is an object of the present invention to improve the performance of the cylindrical magnetron sputtering application by using profiled magnet arrangements to increase the target utilization and the deposition rate while reducing the amount of target material on the chamber walls and shielding of a cylindrical magnetron electrode. It is a further object of the present invention to provide an improved drive assembly for a cylindrical magnetron electrode that is designed to reduce the cost and complexity of delivering high power AC current into a rotating shaft by using common and readily available components.

Further, it is known in cylindrical magnetron sputtering that the film thickness on the substrate can vary, even when the magnets and target are perfectly aligned. These coating thickness variations may be attributed to many influences on the sputtering process not associated with the magnets. Such influences may include vacuum system irregularities such as non-uniform anode distribution and non-uniform system pumping or gas flow across the length of the target. When irregularities in the thickness of the coating on the substrate occur, one can take steps to promote coating uniformity, such as altering the system pumping or gas flow, or raising and lowering the relative heights of the magnets. Such methods of fine tuning the sputtering have some limitations, however. For example, raising and lowering the magnets only allows for tuning on the scale of the fixed lengths of the magnets, and may not permit for finer tuning on a smaller scale. Accordingly, it is another object of the present invention to improve the means by which the magnetic field may be fine tuned to promote more uniform coating of the substrate.

SUMMARY OF THE INVENTION

The present invention provides for a magnet arrangement which is usable as a retrofit magnetic arrangement in a rotatable cylindrical magnetron sputtering electrode. The electrode includes a cathode body defining a magnet receiving chamber, a rotatable cylindrical target surrounding the cathode body, wherein the target is rotatable about the cathode body. The cathode body further defines a magnet arrangement received within the magnet receiving chamber, wherein the magnet arrangement includes a plurality of magnets and, wherein at least one of the magnets is a profiled magnet having a contoured top portion.

The present invention also provides for a rotatable cylindrical magnetron sputtering device that includes the electrode of the present invention and a drive assembly in communication with the cathode body and the cylindrical target, wherein the drive assembly comprises a drive shaft and a motor and, wherein the drive shaft is rotatably connected to the cylindrical target. The drive assembly is adapted to rotate the cylindrical target and to introduce high current AC power into the target surface via the rotating drive shaft without adding highly incremental costs to the overall design of the electrode.

The present invention also includes a magnetron sputtering electrode for use in a rotatable cylindrical magnetron sputtering device, the electrode including a target retaining member for holding a rotatable cylindrical target having a first end and a second end with respect to the axis of the cylindrical target and a cathode body positioned to be within the cylindrical target and defining a magnet receiving chamber. A magnet arrangement is received within the magnet receiving chamber, the magnet arrangement having a first turnaround corresponding to the first end of the rotatable cylindrical target and a second turnaround corresponding to the second end of the rotatable cylindrical target and including a plurality of magnets positioned between the first turnaround and the second turnaround. Each magnet extends from a base of the magnet to a top portion of the magnet in a height direction towards an interior surface of the cylindrical target. Considering the magnet arrangement as having a length direction, a height direction, and a width direction, the length direction of the magnet arrangement corresponds to the axial direction of the rotatable cylindrical target, and the height direction of the magnet arrangement corresponds to the height direction of the plurality of magnets. A plurality of shunts is positioned outside of the magnet receiving chamber. The shunts are positioned away from a side of the magnet arrangement in the width direction of the magnet arrangement. The shunts are located between the first turnaround and the second turnaround and arranged at a plurality of different locations with respect to the length direction of the magnet arrangement. Shunts at different length locations are individually movable relative to the magnet arrangement in at least the height direction, thereby allowing for tuning of the effect of the magnet arrangement on coating thickness uniformity along the axial direction of the cylindrical target by adjusting the position of the shunts. The magnetron sputtering electrode may also include a shunt mount attached to a base plate of the cathode body, a shunt being secured to the shunt mount. The shunt may also include an elongated slot, the shunt being secured to the shunt mount by a fastener inserted through the elongated slot and into the shunt mount, such that the shunt may be attached to the shunt mount at a plurality of height positions. The position of the shunt may be movable in the direction of the length of the magnet arrangement. The cathode body may include a central member, wherein the shunt is secured to the central member with a clamp, the clamp being movable along the length of the central member, such that the shunts may be secured to the central member at a plurality of length positions. The shunt may also include an elongated slot and be secured to the clamp by a fastener inserted through the elongated slot and into the clamp, such that the shunt may be attached to the clamp at a plurality of height positions.

The present invention also includes a method of fine-tuning a magnetron sputtering electrode in a rotatable cylindrical magnetron sputtering device, utilizing a magnetron sputtering electrode that includes a cathode body defining a magnet receiving chamber and a cylindrical target surrounding the cathode body, wherein the target is rotatable about the cathode body. The magnetron sputtering electrode also includes a magnet arrangement received within the magnet receiving chamber, the magnet arrangement including a plurality of magnets. The method comprises the steps of identifying a localized region of a substrate coating having a thickness that is non-uniform beyond a predetermined acceptable deviation; selecting a shunt having a size and shape corresponding to the localized region; and attaching the shunt to the cathode body, proximate to a side of the magnet arrangement and extending in a plane substantially parallel to the side of the magnet arrangement, at a length position along the length of the magnet arrangement corresponding to the localized region of the substrate coating, and at a height position relative to the height of the magnet arrangement, such that the shunt reduces the magnetic field of the magnet arrangement by an effective amount to cause the thickness of the coating of the substrate at the localized region to be within the predetermined acceptable deviation. The magnetron sputtering electrode may include a central member, wherein the shunt is attached to the central member at the length position with a clamp. The shunt may include an elongated slot, wherein the shunt is attached at the height position by inserting a fastener through the elongated slot and into the clamp. The magnetron sputtering electrode may further include a shunt mount attached to a base plate of the cathode body, and the shunt may include an elongated slot, wherein the shunt is attached at the height position by inserting a fastener through the elongated slot and into the shunt mount.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

DETAILED DESCRIPTION OF THE INVENTION

Figure 1:
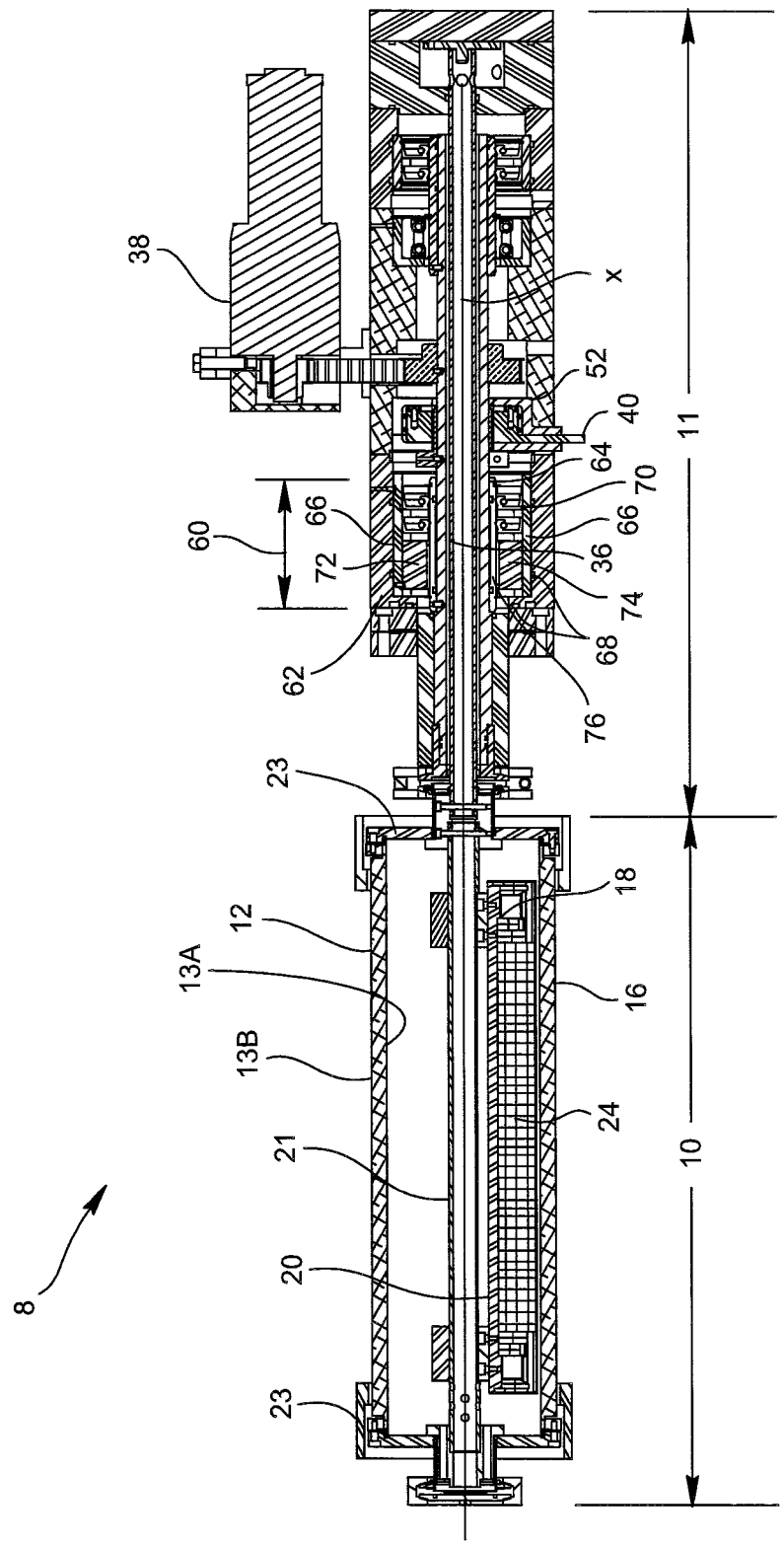
FIG. 1 is a cross sectional view of a rotatable cylindrical magnetron sputtering device made in accordance with the present invention.

For purposes of the description hereinafter, the terms "end", "upper", "lower", "right", "left", "vertical", "horizontal", "top", "bottom", "lateral", "longitudinal" and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting. Further, it is to be understood that the invention may assume various alternative variations and step sequences, except where expressly specified to the contrary.

Figure 1A:
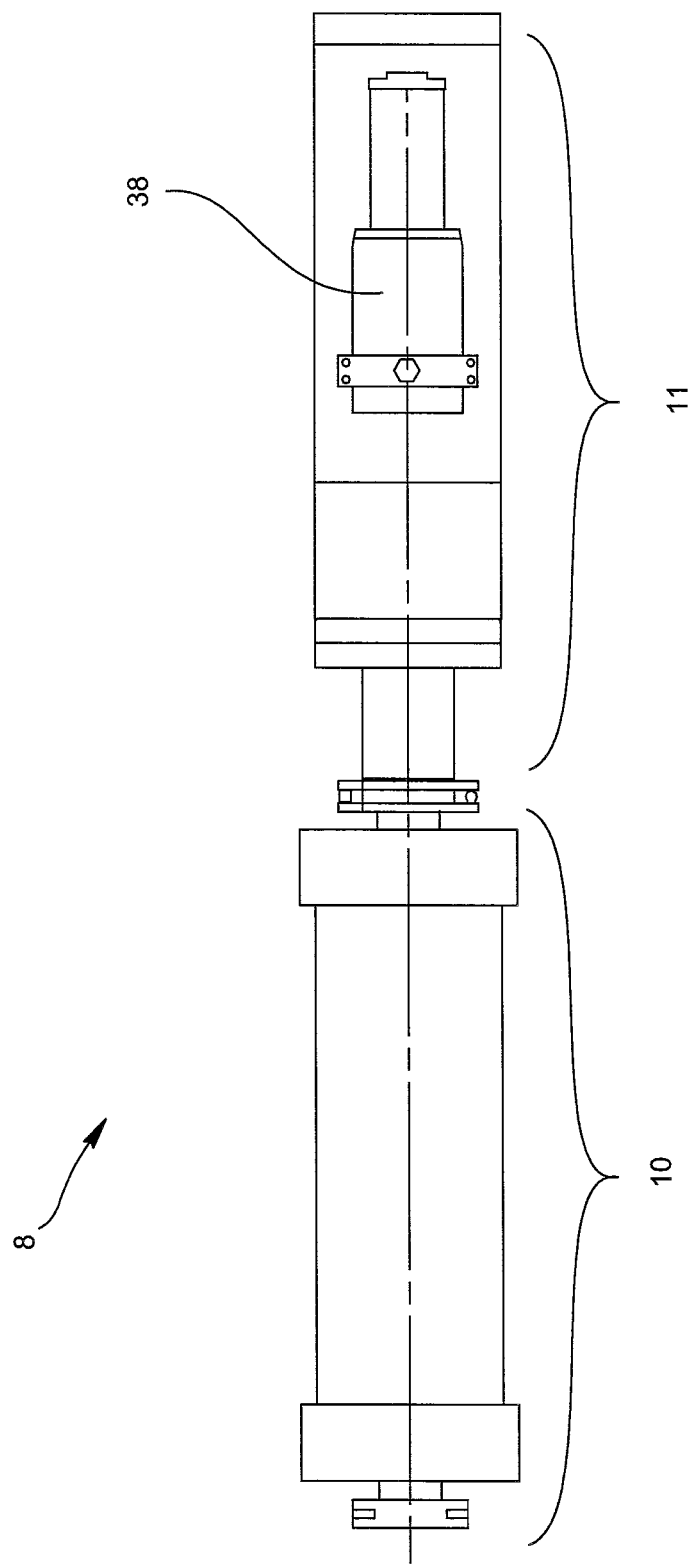
FIG. 1A is a top plan view of the magnetron sputtering device shown in FIG. 1.
Figure 2:
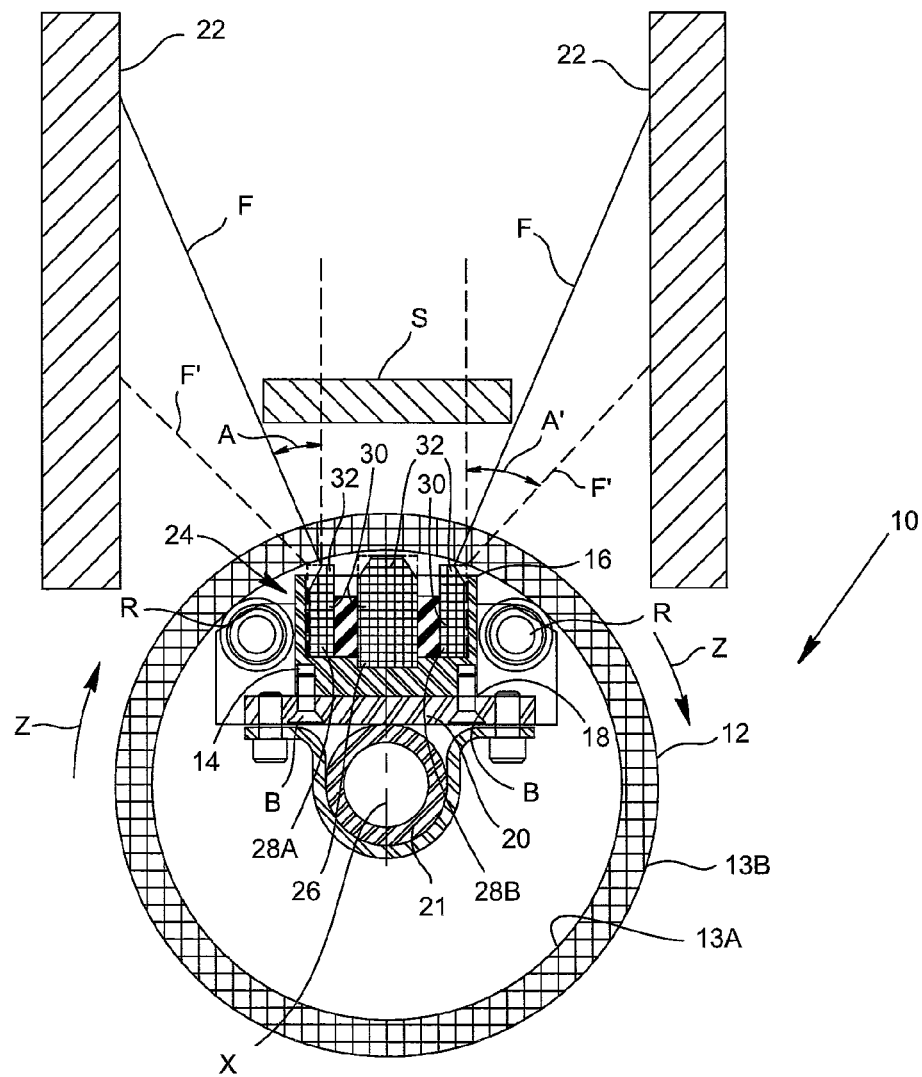
FIG. 2 is a sectional front view of an electrode of the magnetron sputtering device shown in FIG. 1, wherein magnetic flux lines are shown in relation to a substrate.

The present invention provides for a rotatable cylindrical magnetron sputtering device 8 that includes an electrode 10 and a drive assembly 11 attached to the electrode 10 as shown in FIGS. 1 and 1A. Referring to FIGS. 1 and 2, the electrode 10 includes a hollow cylindrical target 12 having an inner surface 13A and an outer surface 13B, a cathode body 14 having a first surface 16 and a second surface 18 received within the cylindrical target 12, a base plate 20 attached to the second surface 18 of the cathode body 14 and a central member 21 such as a shaft or sleeve received within the cylindrical target 12 and attached to the base plate 20 for supporting the cathode body 14, wherein the cylindrical target 12 is rotatable about the cathode body 14 as shown as arrow Z in FIG. 2 about the longitudinal axis X. Referring back to FIG. 1, the cylindrical target 12 is held in place by an annular target retaining member 23, which is in communication with the drive assembly 11. Attachment of the cathode body 14 to the base plate 20 may be accomplished via one or more fasteners such as screws or bolts B or any other suitable fastening arrangement known in the art. Attachment of the base plate 20 to the central member 21 may be accomplished using a clamp or any other suitable clamping arrangement known in the art.

Figure 3:
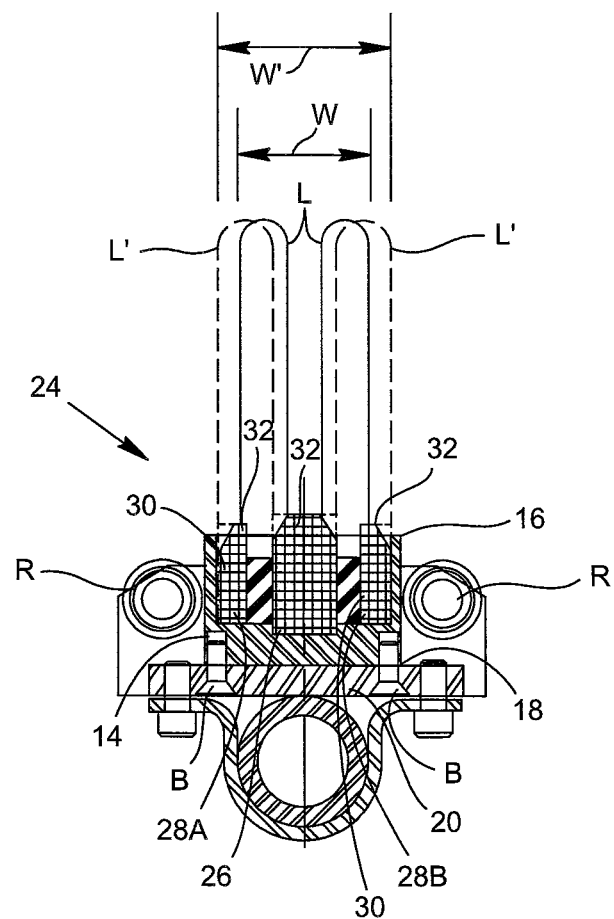
FIG. 3 is a sectional view of a cathode body of the electrode shown in FIG. 2.

Referring to FIGS. 2 and 3, the electrode 10 further includes a guide member such as a pair of rollers R or other guide assemblies positioned adjacent the cathode body 14 and contacting the inner surface 13A of the cylindrical target 12, thereby allowing the target 12 to rotate about the cathode body 14 at a fixed distance. The cylindrical target 12 may be, for example, standard titanium hollow tubing having a 5" inside diameter and a 6" outside diameter, which is held at a fixed distance, such as 0.60", away from the first surface 16 of the cathode body 14 to account for uniformity adjustments. Referring to FIG. 2, a substrate S is positioned directly above the cathode body 14, wherein target material is sought to be deposited onto the substrate S. Chamber walls 22 surrounding the electrode 10 and the substrate S provide a shielding for the sputtering application.

Figure 4:
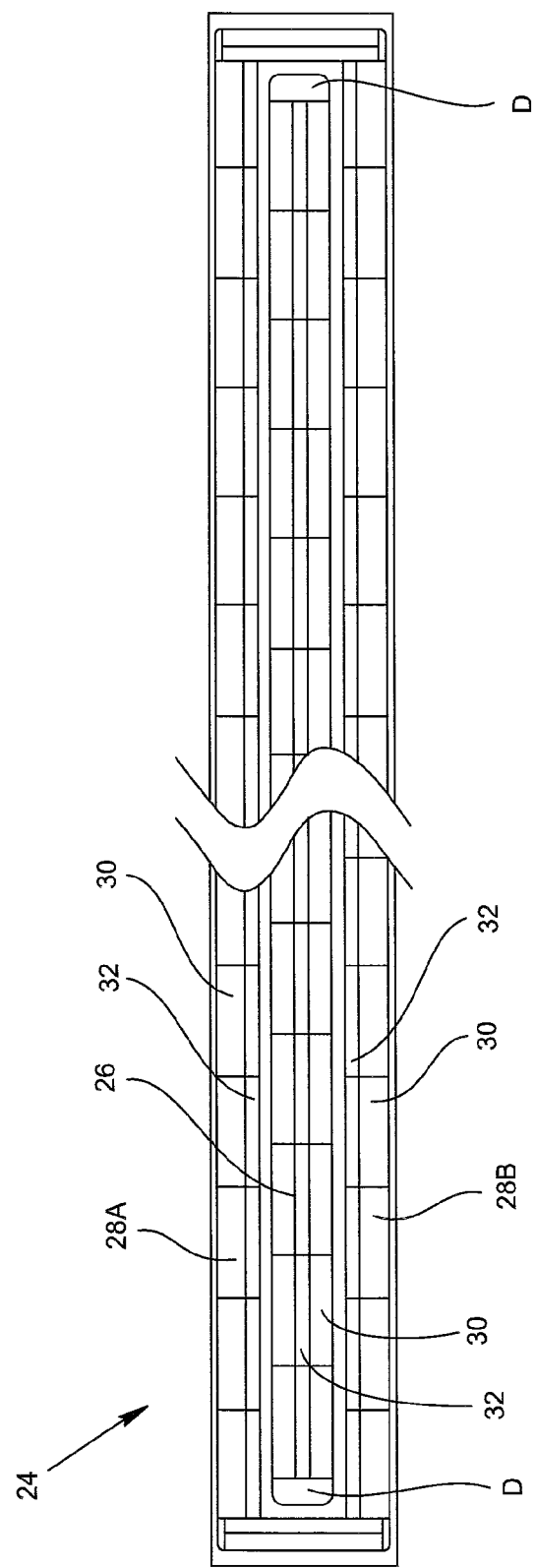
FIG. 4 is a top plan view, partially in section, of a profiled magnet arrangement of the electrode shown in FIG. 2.

Referring to FIGS. 2-4, the cathode body 14 forms a magnet receiving chamber, which contains a profiled magnet arrangement 24. The profiled magnet arrangement 24 uses profiled magnets as shown and described in U.S. Pat. Nos. 5,736,019 and 6,171,461 which are hereby incorporated by reference in their entirety. The magnet arrangement 24 includes a profiled central magnet 26 and profiled end magnets 28A, 28B. Each of the profiled magnets 26, 28A and 28B has a base 30 and a contoured top portion 32. The shape of the contoured top portion 32 is shown angled, but may include sloped, conical, parabolic, convex, and concave shapes. If the contoured top portion 32 is angled, it is preferable for an apex of the contoured top portion 32 to be flat, desirably between 0.01 inch to 0.060 inch or up to half the thickness of the magnets 26, 28A and 28B. Having a flat apex minimizes the possibility of chipping the magnets 26, 28A and 28B during routine use of the completed assembly. Alternatively, the apex may come to a point. The use of such contoured shapes is conducive to directing magnetic flux lines from the contoured top portion 32 of each of the magnets 26, 28A and 28B.

With continued reference to FIGS. 2 and 3, the top portion 32 of the profiled end magnets 28A, 28B is preferably angled on one side away from the central magnet 26 wherein the apex of the top portion 32 is adjacent to the central magnet 26. The top portion 32 of the central magnet 26 is preferably angled on both sides, wherein the apex of the top portion 32 is at the center of the central magnet 26. The magnet arrangement 24 is also shown using a planar magnet having flat surfaces as shown in phantom in FIGS. 2 and 3. The primary magnetic field lines L generated from the profiled magnets 26, 28A and 28B are more centered than the magnetic field lines L' (shown in phantom) generated from planar magnets, such that an overall width W of field lines L is less than an overall width W' of the field lines L' as shown in FIG. 2. The field lines L using the profiled magnets 26, 28A and 28B reduce the off angle sputtering that is inherent to the sputtering process, thus resulting in more of the target sputtering material on the substrate S and less on the chamber walls 22. For example, a computer simulation demonstrated that the magnetic flux lines F generated using the profiled magnet arrangement 24 resulted in an angle reduction of about 15 degrees compared to the magnetic flux lines F' (shown in phantom in FIG. 2) generated using the planar magnet arrangement (i.e., an angle A approximately 15 degrees and angle A' approximately 30 degrees), thus reducing the amount of sputtered material on the chamber walls 22 from about 16.7% to 9.2%. When the sputtered material builds up on the chamber walls 22, it can fall off onto the target 12 or the substrate S thus causing the device to short out or create debris which would reduce the yield or quality of substrate S.

Further, the use of the profile magnets 26, 28A and 28B in electrode 10 provides for a greater increase in magnetic field intensity using the same size magnets in contrast to conventional planar magnets. This increase in the magnetic field intensity and the reduction of flux material on the chamber walls 22 result in an overall rate increase and target utilization in the electrode 10 of the present invention.

Initial processing uniformity may be established by adjusting the dynamic field stroke along the length of the electrode 10 to compensate for known facts such as the tendency for the magnetron ends (i.e. turnaround) to sputter at faster rates than at the center of the target 12. Therefore, it is contemplated that the ends of the central magnet 26 of the profiled magnet arrangement 24 have a diverter magnet D of a different profile such as is shown in FIG. 4. This magnet having a different profile can slow down the sputtering effect at the ends, thus reducing erosion of the target 12 at these ends.

Referring to FIG. 1, the drive assembly 11 of the magnetron sputtering device 8 includes a drive unit 34, wherein the drive unit 34 includes a drive shaft 36 and a motor 38. The drive shaft 36 is rotatably coupled to the retaining member 23. The motor 38 is coupled to the drive shaft 36, so that activation of the motor 38 causes the drive shaft 36 to rotate about an axis "X", which in turn causes the retaining member 23 having the attached cylindrical target 12 to rotate about the cathode body 14. The drive assembly 11 further includes a brush assembly 40 surrounding the drive shaft 36, wherein the brush assembly 40 coacts with the rotating drive shaft 36 to supply AC and DC electrical current to the cathode body 14, and a cathode vacuum seals and supports chamber assembly 60 for introducing high current AC power from the atmosphere into the rotating vacuum drive shaft 36 with negligible eddy current heating effects. The remaining components of the drive assembly 11 will not be described because these components are known in the art and are common for typical rotating cylindrical magnetron sputtering devices.

Referring to FIG. 1, the drive shaft 36 is electrically connected to the central member 21, which is affixed to the base plate 20 of the cathode body 14. Rotation of the drive shaft 36 causes the brush assembly 40 to generate high electrical current to the drive shaft 36, which transfers the current through the central member 21 and to the base plate 20 and then to the cathode body 14. The central member 21 may be, for example, a shaft made of a conductive material in order to carry electrical current to the cathode body 14.

Figure 5:
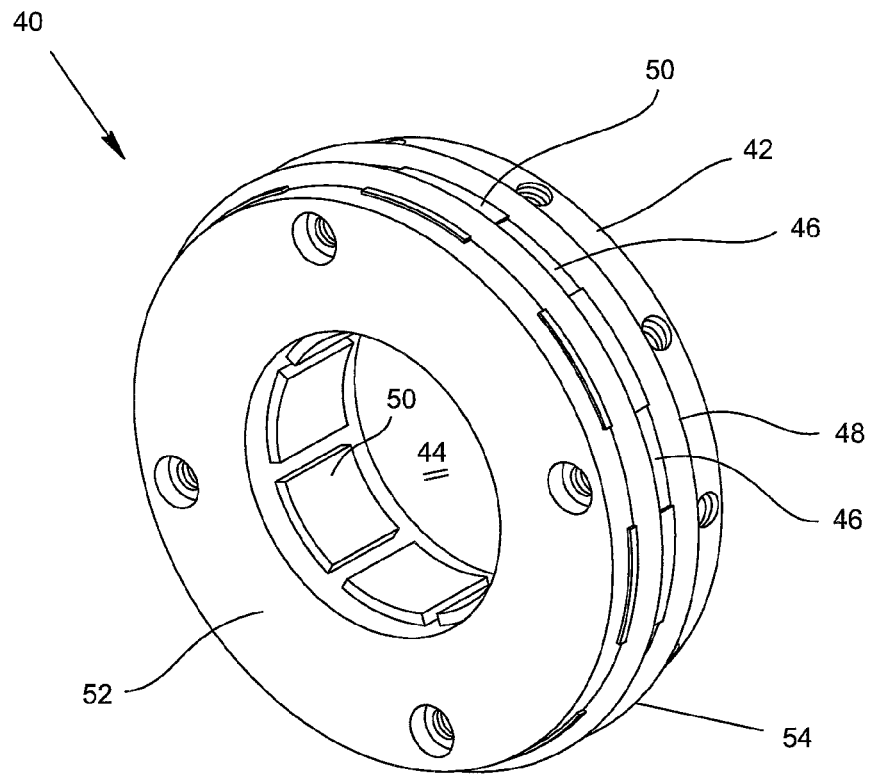
FIG. 5 is a perspective view of a high current brush assembly of the rotatable cylindrical magnetron sputtering device shown in FIG. 1.
Figure 6:
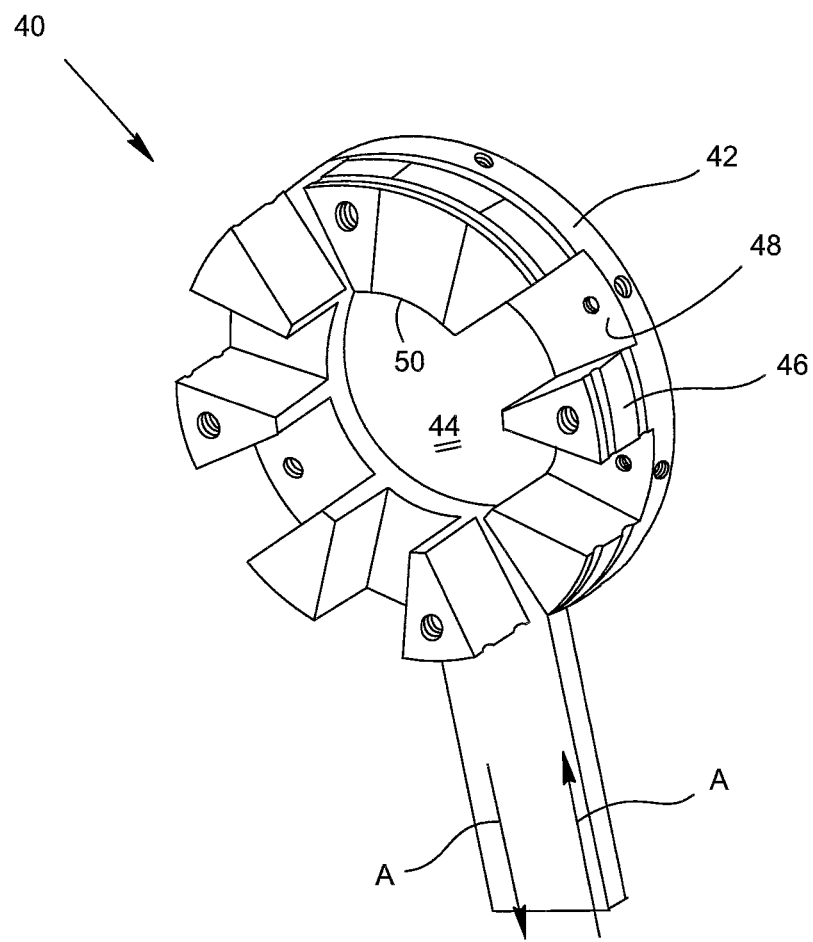
FIG. 6 is a perspective view of a housing of the high current brush assembly shown in FIG. 5.

FIGS. 5 and 6 show the high current brush assembly 40 that includes a disc-shaped housing 42 defining a central opening 44 therein, a plurality of circumferentially spaced spacers 46 arranged on a front surface 48 of the housing 42, a plurality of brushes 50 positioned between each spacer 46 and a cap 52 attached to the front surface 48 of the housing 42. The housing 42 is preferably made of copper. The brushes 50 may be standard motor brushes made of, for example, a metal graphite material such as a low grade graphite or a graphite having a slightly higher conductivity. These brushes are readily available by most major suppliers of motors. In operation, specifically when operating at high currents in the AC power mode, cooling of the brushes 50 is required to increase further the current capacity of the brushes 50. FIG. 6 shows the housing 42 without the cap 52 being supplied with cooling water as represented by arrows A, which circulates within the housing 42 thereby cooling the brushes 50. Compression of the brushes 50 onto the rotating shaft 36 extending through the opening 44 is achieved by the use of a garter spring 54 shown in FIG. 5. By using small individual segments of brushes 50 and a copper housing 42, the surface area of the entire brush assembly 40 is increased as well as the ability to cool the brushes 50, thereby achieving a higher current capacity.

Figure 7:
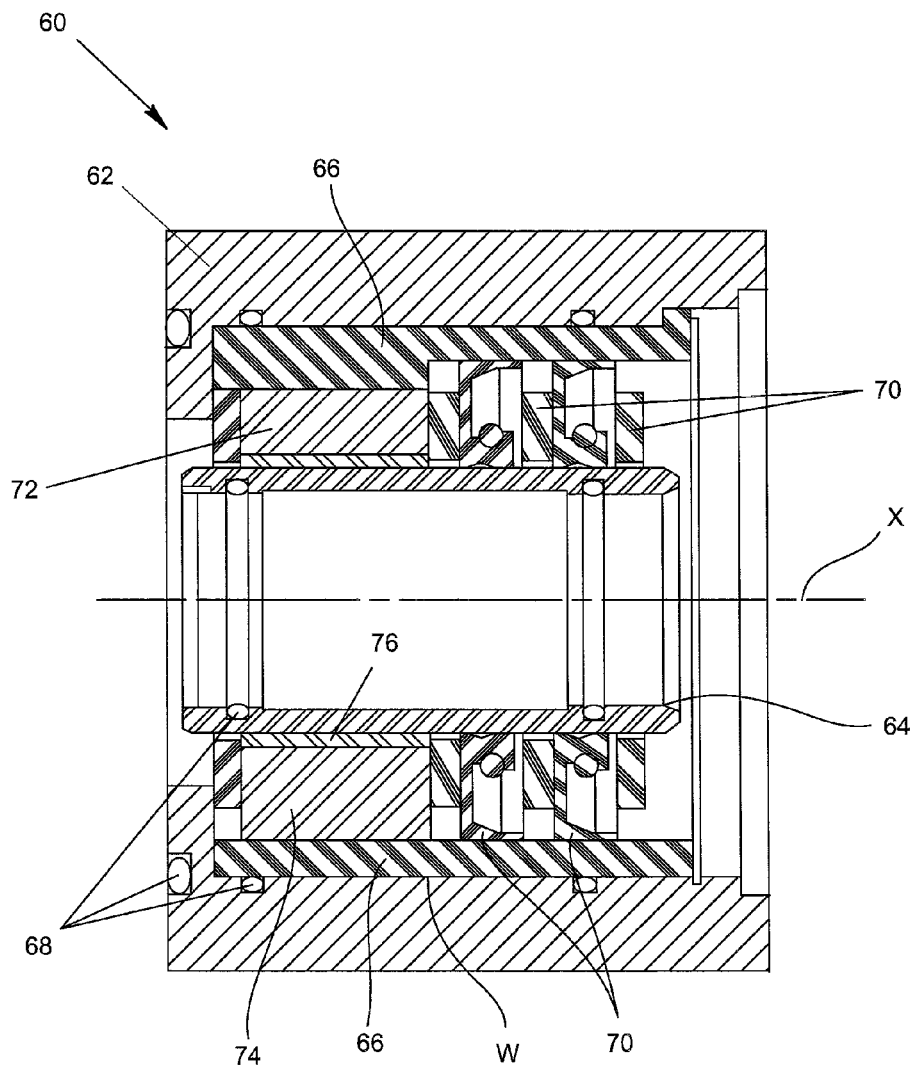
FIG. 7 is a sectional view of a cathode vacuum seal chamber of the rotatable cylindrical magnetron sputtering device shown in FIG. 1.

FIG. 7 shows a sectional view of the cathode vacuum seals and support chamber assembly 60 that includes a housing 62 and a wear sleeve 64 centrally positioned within the housing 62. An insulating member 66 is positioned between a wall W of the housing 62 and the sleeve 64 for electrically insulating the housing 62 from high voltage and electrical current. Atmosphere to vacuum seals are achieved through static O-rings 68 positioned between the housing wall W and the insulating member 66 as well as spaced rotary vacuum seals 70 positioned between the sleeve 64 and the insulating member 66. Spacer blocks 72 and 74 keep the rotary seals 70 spaced apart and aligned. The drive shaft 36 carrying the current (shown in FIG. 1) extends through the sleeve 64 and rotates about axis "X", wherein the sleeve 64 functions as a front support bushing as well as a vacuum seal surface. A graphite or plastic bearing 76 is located between the sleeve 64 and the vacuum seals 70. Preferably, the bearing 76 may be manufactured from highly durable plastics such as polyimides or from highly durable graphite. The size of the bearing 76 may vary depending on the cathode size and the spacers 72, 74 as well as the sleeve 64. It is important to preferably use materials for the components that cannot only support a load induced by the cathode, but also prevent eddy currents from setting up, thereby causing extreme heating. For example, conductive materials such as highly durable plastics may be used for the bearing 76 and the other components within the vacuum assembly 60 because the high voltage is kept off of the vacuum housing 62 by the insulating member 66, thereby making these components non-susceptible to eddy current heating.

The present invention also provides for a method of improving target utilization and deposition rate in a cylindrical magnetron sputtering application that includes providing a substrate S and a rotatable cylindrical magnetron device 8 of the present invention. The cylindrical target 12 is rotated around a magnet arrangement 24 and target material for the cylindrical target 12 is obtained and deposited on the substrate S.

In the event that the thickness of a substrate coating in a localized region is non-uniform beyond a predetermined acceptable deviation, such as within 2-5% uniformity, fine tuning of the magnetic field from the magnet arrangement 24 may be desired.

Figure 8:
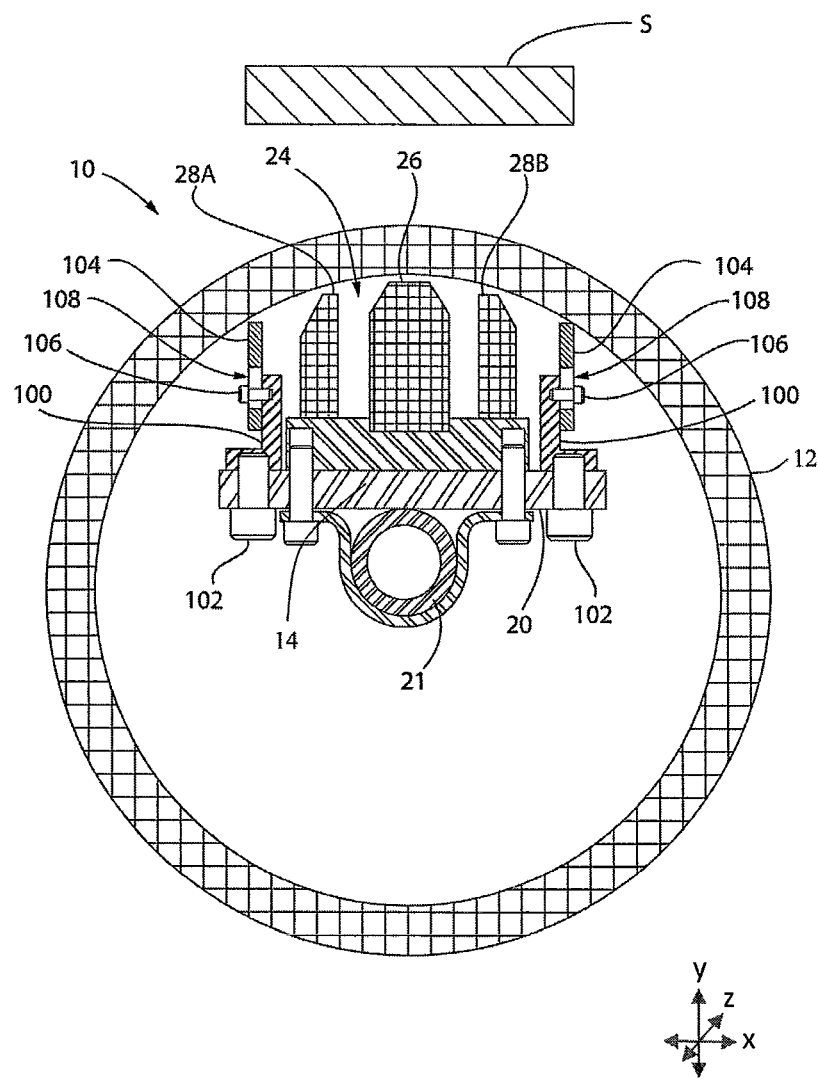
FIG. 8 is a cross-sectional view of an electrode of a magnetron sputtering device similar to that shown in FIG. 2, but having two shunts.
Figure 9:
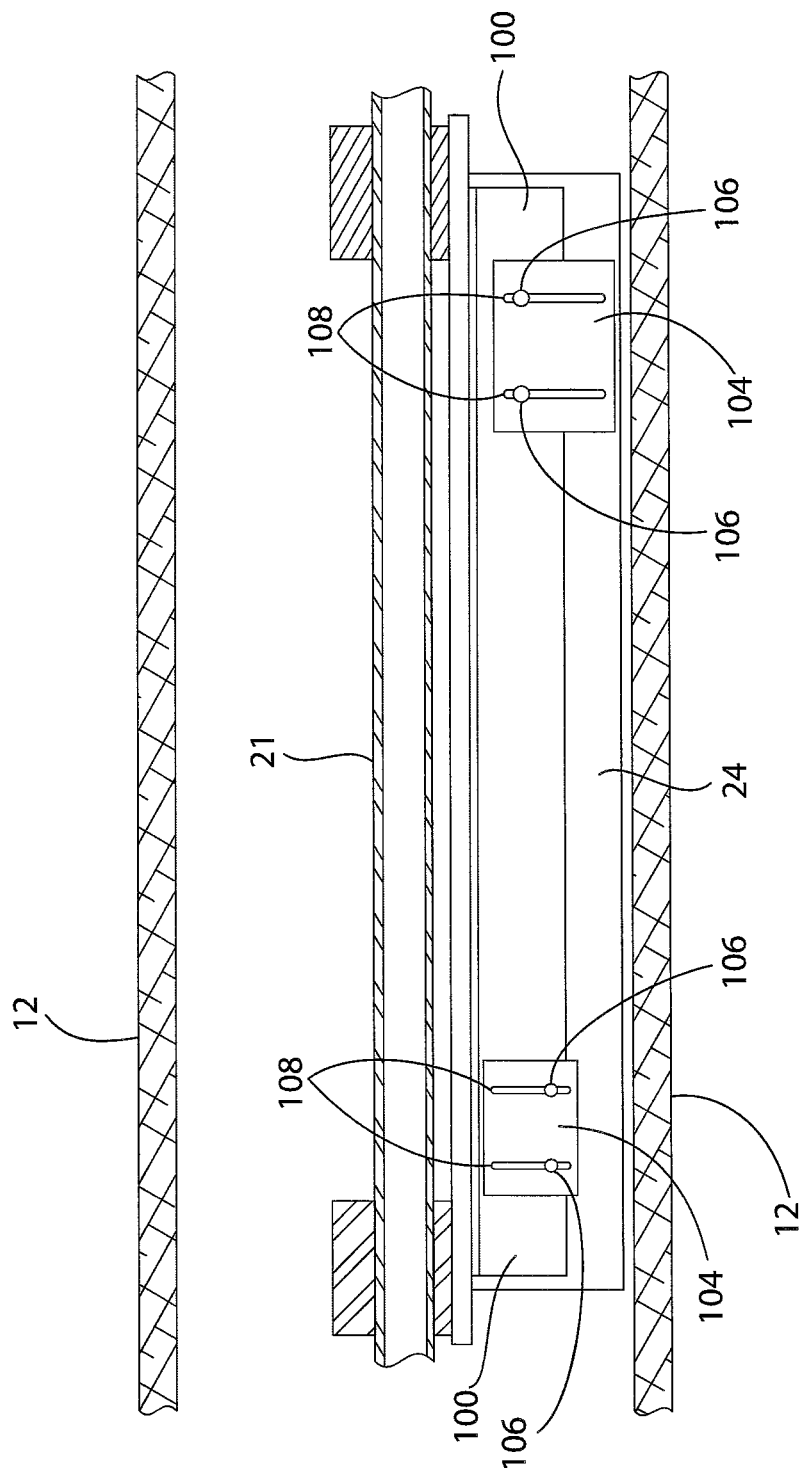
FIG. 9 is a partial cross-sectional view of an electrode of a magnetron sputtering device similar to that shown in FIG. 1, but having two shunts.

FIGS. 8 and 9 show an embodiment of a cylindrical sputtering magnetron having a shunting mechanism which may be used to fine tune the magnetic field to promote uniform coating of the substrate. FIG. 8 is a cross-sectional view similar to FIG. 2, and FIG. 9 is a cross-sectional view of the electrode portion of the sputtering magnetron device similar to the view in FIG. 1. The electrode 10 and magnet arrangement 24 shown in FIGS. 8 and 9 are intended to be exemplary. As will be understood by those skilled in the art, the present shunting invention may be utilized with various alternative cylindrical sputtering apparatuses having different electrode and magnet arrangement 24 configurations. As illustrated in FIG. 8, the magnetron sputtering electrode 10 includes a cathode body 14 defining a magnet receiving chamber, a cylindrical target 12 surrounding the cathode body 14, a magnet arrangement 24 received within the magnet receiving chamber, and a plurality of shunts 104 secured to the cathode body 14 outside of the magnet receiving chamber. Considering the magnet arrangement as having a length direction, a height direction, and a width direction, with the length direction of the magnet arrangement corresponding to the axial direction of the rotatable cylindrical target, and the height direction of the magnet arrangement corresponding to the height direction of a plurality of magnets of the magnet arrangement, the plurality of shunts are positioned away from a side of the magnet arrangement in the width direction of the magnet arrangement. Each magnet extends from a base portion in the height direction of the magnet arrangement towards an interior surface of the cylindrical target.

Figure 10A:
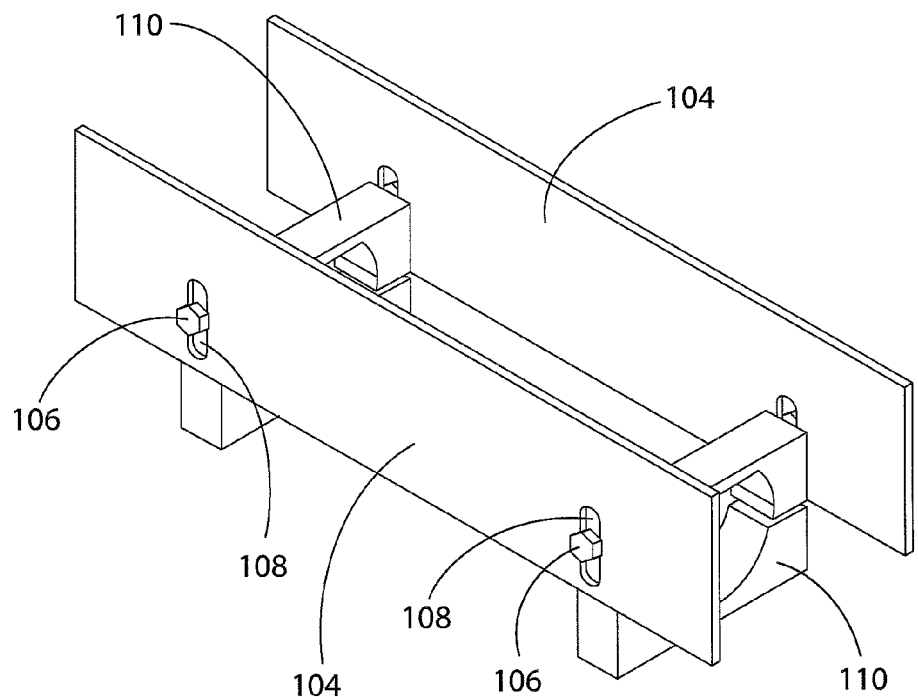
FIG. 10A is a perspective view of a clamp apparatus for mounting the shunts in accordance with the present invention.
Figure 10B:
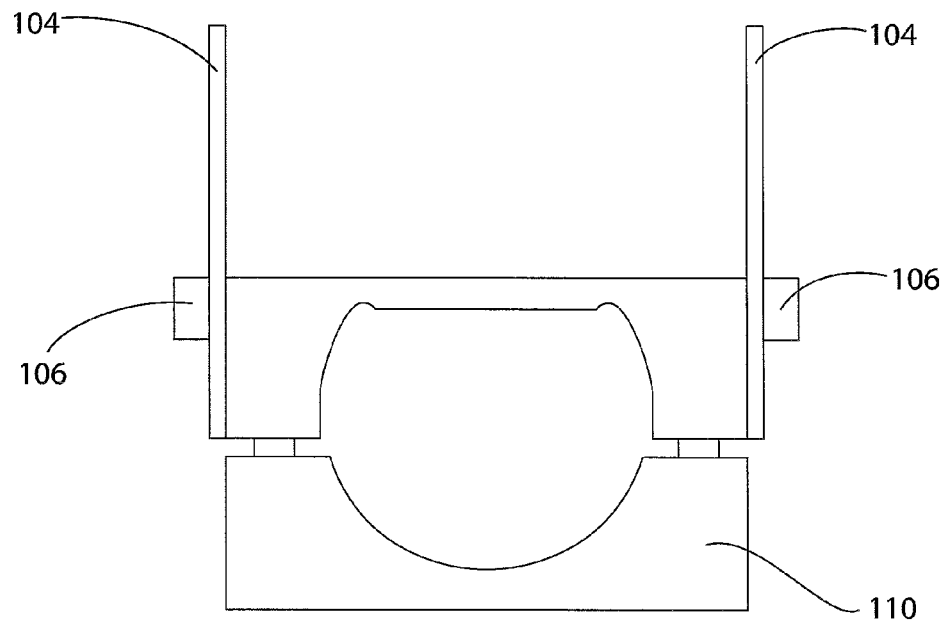
FIG. 10B is an end view of the clamp apparatus shown in FIG. 10A.

Referring to FIG. 8, attached to the base plate 20 are two shunt mounts 100. The shunt mounts 100 extend in a plane substantially perpendicular to the base plate 20 and substantially parallel to the magnet arrangement 24. The shunt mounts shown in FIG. 2 are attached to the base plate 20 via screws 102, but may be attached via other fastening means known in the art such as nuts and bolts, clamps, or welds. The shunt mounts 100 may also be attached to the central member 21 or other portion of the electrode, as long as the shunt mounts are securely mounted and are stationary with respect to the magnet arrangement 24. FIGS. 10A and 10B show a shunt assembly wherein shunts 104 may be attached to the magnet support tube or central member 21 with clamps 110 around the magnet support tube or central member 21. The clamps 110 can be movably positioned along the length of the magnet support tube to change the location of the shunts 104 to any of a plurality of distinct positions, so as to place the shunts 104 at a length position corresponding to the localized region of the non-uniform substrate coating.

Referring again to FIGS. 8 and 9, attached to the outer surfaces of the shunt mounts 100 are two shunts 104. The shunts 104 are essentially rectangular plates made from a ferromagnetic material such as stainless steel or any other suitable magnetic material. The shunts 104 are placed in a position away from a side of the magnet arrangement 24 with respect to the width direction of the magnet arrangement to influence the magnetic field by generally shunting the field, or inhibiting the magnetic flux from the magnet arrangement 24 through the shunts 104. Like the shunt mounts 100, the shunts 104 extend in a plane substantially perpendicular to the base plate 20 and substantially parallel to the magnet arrangement 24. The shunts 104 are secured to the shunt mounts 100 via fasteners or screws 106 inserted through elongated slots 108 in the shunts 104. The slots 108 are wide enough such that the threaded portion of the screw 106 may fit through the slot 108 and into the shunt mount 100, but narrow enough that the head of the screw 106 does not fit through the slot 108, in order that the shunts 104 may be securely attached to the shunt mounts 100. Similarly, as shown in FIGS. 10A and 10B, fasteners or screws 106 and slots 108 may be used to attach the shunts 104 to the clamps 110.

The shapes, lengths, heights, and widths of the shunt mounts 100 and shunts 104 may vary depending upon the positioning and amount of shunting desired by a user of the magnetron sputtering apparatus. The shunts 104 shown in FIG. 9 are located between a first turnaround of the magnet arrangement and a second turnaround of the magnet arrangement, at which diverter magnets may be positioned as previously discussed, and the shunts shown in FIG. 9 have different sizes, with the shunt 104 on the left being generally smaller than the one on the right. Further, the screws 106 and elongated slots 108 permit the shunts 104 to be movably positioned with respect to the magnet arrangement 24. In particular, the screws 106 may be loosened freeing the shunts 104 to move upward or downward along the direction of the slots 108, and then the screws 106 may be tightened again to re-secure the shunts 104 to the shunt mounts 100. The shunts 104 may thus be positioned in a plurality of distinct height positions. For example, the left shunt 104 in FIG. 9 is positioned to cover approximately half the height of the magnet arrangement 24, whereas the right shunt 104 in FIG. 9 is positioned to cover approximately the entire height of the magnet arrangement 24. As is further explained below and shown in FIGS. 11-13 at different locations, are individually movable relative to the magnet arrangement in at least the height direction. The height position of the shunts 104 directly affects the magnetic flux density at the surface of the target, with more coverage by the shunts 104 generally resulting in a lower magnetic flux density at the target. One or more shunts 104 may be placed on one or both sides of the magnet arrangement 24, as is required to produce the desired shunting effect. As will be appreciated by those skilled in the art, the dimensions of the shunts 104 and the slots 108 may be varied in order to allow other amounts of coverage and shunting of the magnet arrangement 24.

The ability to vary the size, shape, and position of the shunts 104 in accordance with the present invention allows for precise fine tuning of the sputtering to ensure uniform coating of the substrate. For example, if a localized portion of a coating on a substrate were non-uniformly thick beyond an acceptable deviation, one way to adjust the resulting thickness would be to reposition the magnet heights in the magnet arrangement 24 near the area which is too thick. However, a typical magnet length in such an arrangement is fixed and might be about 20 inches typically, and so such repositioning of magnet heights would be a relatively crude tuning of the sputtering apparatus. By contrast, using the present invention, one can place a shunt 104 having an essentially infinite variety of shapes, sizes, and positions to shunt the magnetic field of the magnet arrangement 24. In this way, if a coating thickness irregularity is smaller than the size of the magnets, a smaller and precisely sized and placed shunt can be utilized to influence the magnetic field in a way that will reduce the coating thickness in the localized region of excessive thickness. Thus, a shunt 104 may be selected for its shape and size to correspond to the non-uniform localized region of the substrate coating in a manner more precise than the scale of the magnets in the magnet arrangement 24. Generally, the shunts 104 should be selected and positioned with an appropriate height position and length position to produce an effective amount of shunting, i.e., an amount that results in uniform coating of the substrate within the predetermined acceptable deviation.

Figure 11:
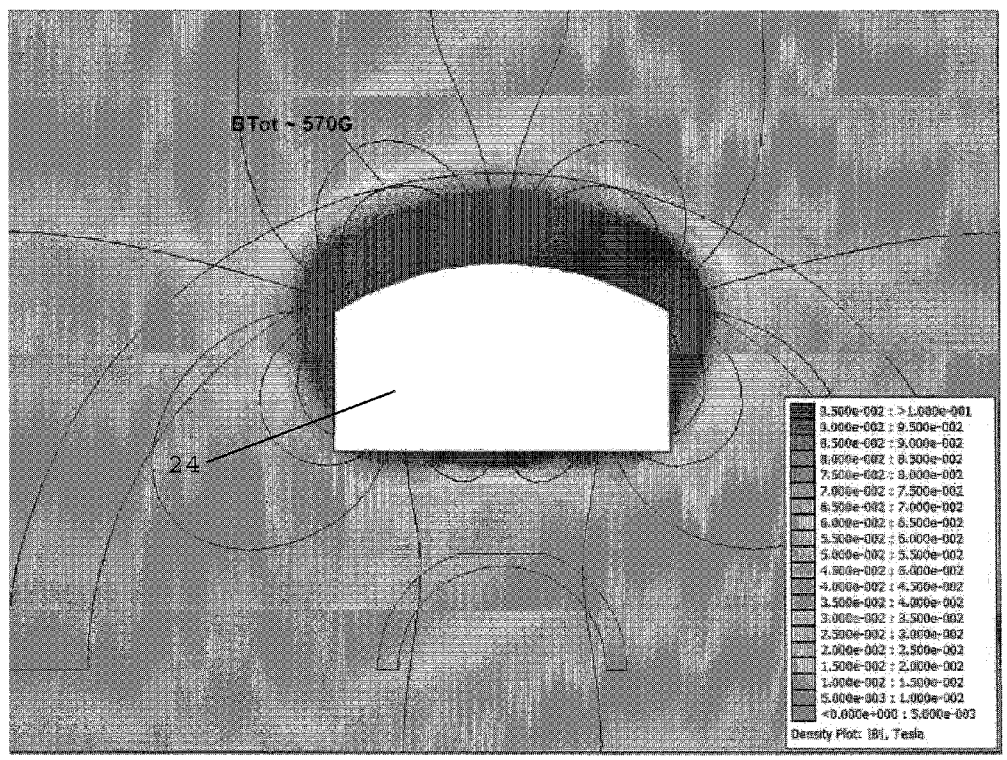
FIG. 11 is a computer modeled graph showing the magnetic field produced by an un-shunted magnet arrangement.
Figure 12:
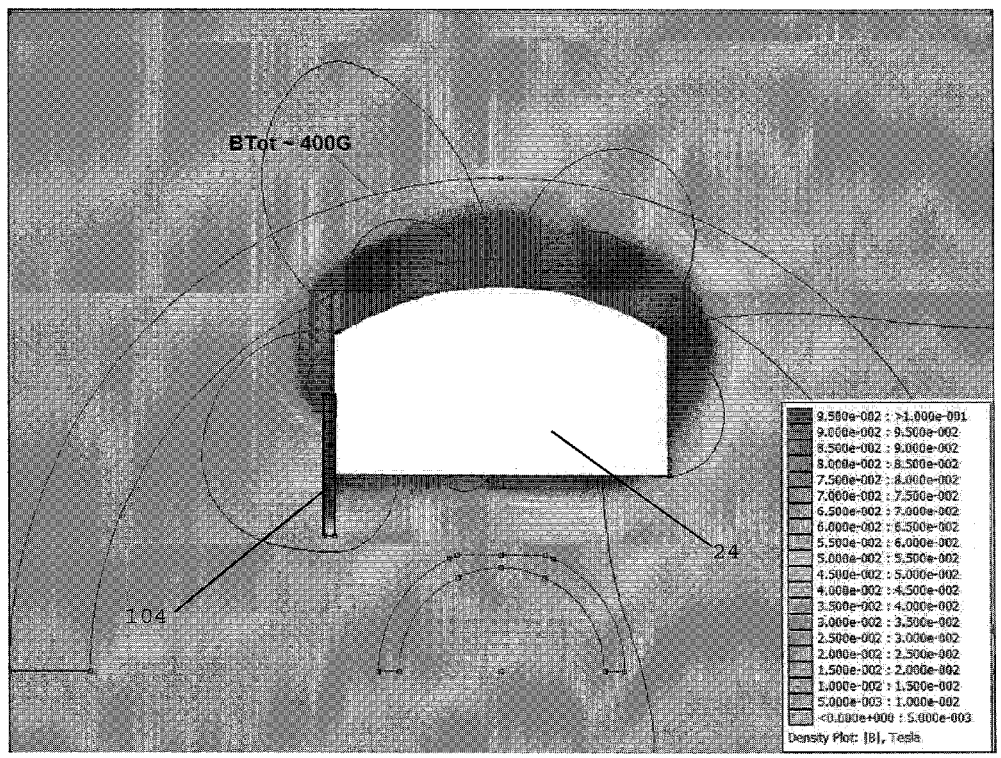
FIG. 12 is a computer modeled graph showing the magnetic field produced by the magnet arrangement shown in FIG. 11, wherein a shunt is used to cover approximately half the height of one side of the magnet arrangement.
Figure 13:
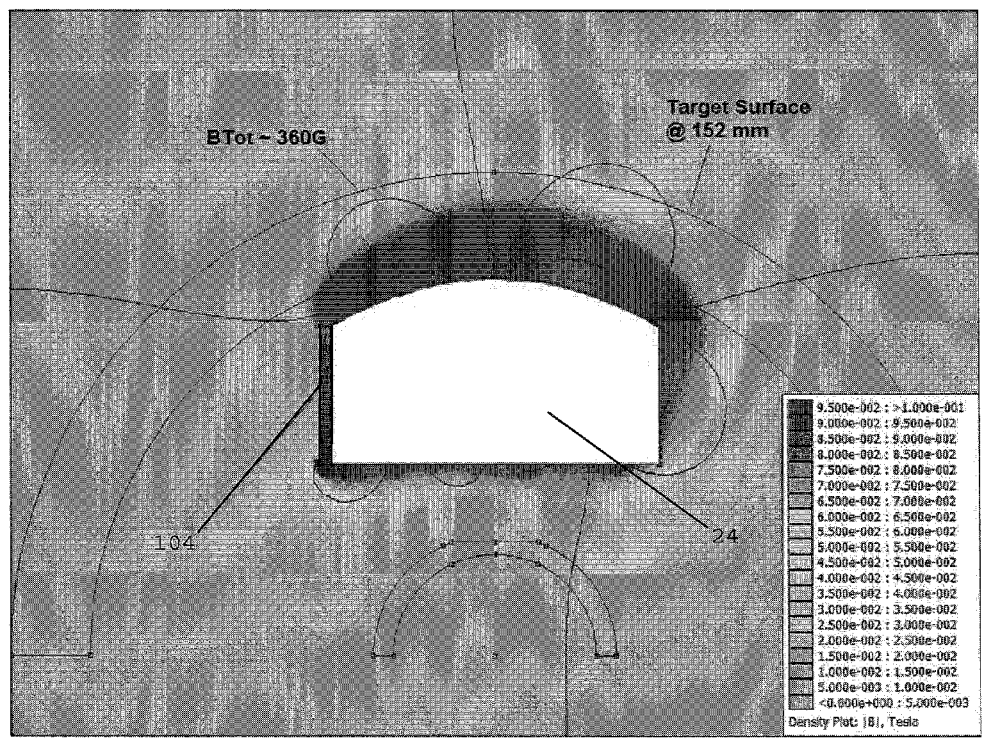
FIG. 13 is a computer modeled graph showing the magnetic field produced by the magnet arrangement shown in FIG. 11, wherein a shunt is used to cover approximately the entire height of one side of the magnet arrangement.

FIGS. 11-13 are three computer modeled graphs showing the various magnetic fields produced by a magnet arrangement 24 that is unshunted, one that includes a shunt 104 covering half the height of one side of the magnet arrangement 24, and one that includes a shunt 104 covering the entire height of one side of the magnet arrangement 24, respectively. Generally the shunting on one side of the magnet arrangement 24 reduces the maximum magnetic field strength at the target, and causes the field to become asymmetrical with respect to the magnet arrangement 24. More coverage of the magnet arrangement 24 by the shunt 104 causes a greater decrease in the field strength, and a greater degree of field asymmetry. In particular, for the examples of FIGS. 11-13, the un-shunted magnet arrangement in FIG. 11 yields a magnetic flux density of approximately 570 G at the target surface. With the shunt 104 positioned to cover approximately half of one side of the magnet arrangement 24 in FIG. 12, the magnetic flux density is reduced to approximately 400 G at the target surface. Positioning the shunt 104 to cover approximately the entire side of the magnet arrangement 24 in FIG. 13 lowers the magnetic flux density to approximately 360 G.

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the intended claims and any and all equivalents thereof.

The invention claimed is:

1. A magnetron sputtering electrode for use in a rotatable cylindrical magnetron sputtering device, the electrode comprising:
    a target retaining member for holding a rotatable cylindrical target, the rotatable cylindrical target having a first end and a second end with respect to the axis of the cylindrical target;
    a cathode body positioned to be within the cylindrical target and defining a magnet receiving chamber;
    a magnet arrangement received within the magnet receiving chamber, the magnet arrangement having a first turnaround corresponding to the first end of the rotatable cylindrical target and a second turnaround corresponding to the second end of the rotatable cylindrical target, the magnet arrangement comprised of a plurality of magnets positioned between the first turnaround and the second turnaround, wherein each magnet extends from a base of the magnet to a top portion of the magnet in a height direction towards an interior surface of the cylindrical target, wherein the magnet arrangement has a length direction, a height direction, and a width direction, wherein the length direction of the magnet arrangement corresponds to the axial direction of the rotatable cylindrical target, and wherein the height direction of the magnet arrangement corresponds to the height direction of the plurality of magnets; and
    a plurality of shunts outside of the magnet receiving chamber and spaced away from a side of the magnet arrangement in the width direction of the magnet arrangement, and
    wherein the plurality of shunts is located between the first turnaround and the second turnaround and arranged at a plurality of different locations with respect to the length direction of the magnet arrangement, and wherein the shunts at different length locations are individually movable relative to the magnet arrangement in at least the height direction, thereby allowing for tuning of the effect of the magnet arrangement on coating thickness uniformity along the axial direction of the cylindrical target by adjusting the position of the shunts.

2. The magnetron sputtering electrode of claim 1, further comprising a shunt mount attached to a base plate of the cathode body, at least one shunt being secured to the shunt mount.

3. The magnetron sputtering electrode of claim 2, wherein the at least one secured shunt includes an elongated slot and is secured to the shunt mount by a fastener inserted through the elongated slot and into the shunt mount, such that the at least one secured shunt is capable of being attached to the shunt mount at a plurality of height positions.

4. The magnetron sputtering electrode of claim 1, wherein the position of the shunts at different length locations are individually movable in the length direction of the magnet arrangement.

5. The magnetron sputtering electrode of claim 4, the cathode body further comprising a central member, wherein at least one shunt is secured to the central member with a clamp, the clamp being movable along the length of the central member, such that the at least one secured shunt is capable of being secured to the central member at a plurality of length positions.

6. The magnetron sputtering electrode of claim 5, wherein the at least one secured shunt includes an elongated slot and is secured to the clamp by a fastener inserted through the elongated slot and into the clamp, such that the at least one secured shunt is capable of being attached to the clamp at a plurality of height positions.

7. The magnetron sputtering electrode of claim 1, wherein a distance between a closest portion of at least one shunt and a center of the magnet arrangement is greater than a distance between a farthest portion of the magnet arrangement and the center of the magnet arrangement.

8. The magnetron sputtering electrode of claim 2, wherein the at least one secured shunt is secured to an outer surface of the shunt mount, such that the shunt mount is disposed between the at least one secured shunt and the magnet arrangement.

9. The magnetron sputtering electrode of claim 2, wherein the at least one secured shunt is formed from a ferromagnetic material, and wherein the ferromagnetic material is secured to the shunt mount.

10. The magnetron sputtering electrode of claim 9, wherein the at least one secured shunt includes an elongated slot in the ferromagnetic material, wherein the at least one secured shunt is secured to the shunt mount by a fastener inserted through the elongated slot and into the shunt mount, such that the at least one secured shunt is capable of being attached to the shunt mount at a plurality of height positions.

11. A magnetron sputtering electrode for use in a rotatable cylindrical magnetron sputtering device, the electrode comprising:
    a target retaining member for holding a rotatable cylindrical target, the rotatable cylindrical target having a first end and a second end with respect to the axis of the cylindrical target;
    a magnet arrangement positioned to be within the cylindrical target, the magnet arrangement having a first turnaround corresponding to the first end of the rotatable cylindrical target and a second turnaround corresponding to the second end of the rotatable cylindrical target, the magnet arrangement comprised of a plurality of magnets positioned between the first turnaround and the second turnaround, wherein each magnet extends from a base of the magnet to a top portion of the magnet in a height direction towards an interior surface of the rotatable cylindrical target, wherein the magnet arrangement has a length direction, a height direction, and a width direction, wherein the length direction of the magnet arrangement corresponds to the axial direction of the rotatable cylindrical target, and wherein the height direction of the magnet arrangement corresponds to the height direction of the plurality of magnets;
    a plurality of shunts spaced away from a side of the magnet arrangement in the width direction of the magnet arrangement,
    wherein the shunts are located between the first turnaround and the second turnaround and arranged at a plurality of different locations with respect to the length direction of the magnet arrangement, and wherein the shunts at different length locations are individually movable relative to the magnet arrangement in at least the height direction, thereby allowing for tuning of the effect of the magnet arrangement on coating thickness uniformity along the axial direction of the cylindrical target by adjusting the position of the shunts.

12. The magnetron sputtering electrode of claim 11, further comprising:
- a hollow central member positioned to be within the cylindrical target and defining an axis of the cylindrical target; and
- a base plate fixed to the central member and extending along an axial direction of the cylindrical target, the base plate having a lower surface facing the central member and an upper surface for facing the cylindrical target,
- wherein the magnet arrangement is positioned on the upper surface of the base plate, each magnet including a base portion facing the upper surface of the base plate and a top portion for facing the cylindrical target.

13. The magnetron sputtering electrode of claim 11, wherein the plurality of shunts includes a plurality of first shunts spaced away from a side of the magnet arrangement in a first direction and a plurality of second shunts spaced away from a side of the magnet arrangement in a second direction opposite to the first direction.

14. The magnetron sputtering electrode of claim 13, wherein the shunts are individually movable in a direction towards and away from the base plate.

15. The magnetron sputtering electrode of claim 13, wherein the shunts are individually movable in an axial direction of the cylindrical target.

16. The magnetron sputtering electrode of claim 13, wherein the shunts include a plurality of sizes of shunts.

* * * * *